United States Patent

O'Donnell et al.

Patent Number: 6,069,035
Date of Patent: May 30, 2000

[54] TECHNIQUES FOR ETCHING A TRANSITION METAL-CONTAINING LAYER

[75] Inventors: Robert John O'Donnell, San Francisco; Gregory James Goldspring, Alameda, both of Calif.

[73] Assignee: Lam Researh Corporation, Fremont, Calif.

[21] Appl. No.: 08/994,797

[22] Filed: Dec. 19, 1997

[51] Int. Cl.[7] .............................................. H01L 21/3065
[52] U.S. Cl. ........................................... 438/220; 438/720
[58] Field of Search ................................. 216/58, 75, 62; 438/710, 722, 706, 720

[56] References Cited

U.S. PATENT DOCUMENTS

| | | | |
|---|---|---|---|
| 4,838,994 | 6/1989 | Gulde et al. | 156/643 |
| 4,923,828 | 5/1990 | Gluck et al. | 437/225 |
| 5,145,554 | 9/1992 | Seki et al. | 156/643 |
| 5,269,878 | 12/1993 | Page et al. | 438/720 |
| 5,300,187 | 4/1994 | Lesk et al. | 156/628 |
| 5,304,775 | 4/1994 | Fujiwara et al. | 156/643 |
| 5,318,664 | 6/1994 | Saia et al. | 216/67 |
| 5,658,820 | 8/1997 | Chung | 438/3 |
| 5,674,357 | 10/1997 | Sun et al. | 156/659.11 |
| 5,753,567 | 5/1998 | Banan et al. | 438/720 |

FOREIGN PATENT DOCUMENTS

| | | |
|---|---|---|
| 0386518A1 | of 0000 | European Pat. Off. . |
| 0 823 726 A1 | 2/1998 | European Pat. Off. . |

OTHER PUBLICATIONS

PCT Notification of Transmittal of the International Search Report or the Declaration, dated Apr. 14, 1999.

J. Ruzyllo et al., "Electrical Evaluation of Wet and Dry Cleaning Procedures for Silicon Device Fabrication", May 1989, Journal of the Electrochemical Society.

K. J. Nordheden, et al., "Predictable Reactive Ion Etching of GaAs and AlGaAs in HCl/Ar RF Discharges", Feb. 1990, Journal of the Electrochemical Society.

(List continued on next page.)

Primary Examiner—Benjamin L. Utech
Assistant Examiner—Lynette T. Umez-Eronini
Attorney, Agent, or Firm—Beyer Weaver Thomas & Nguyen, LLP

[57] ABSTRACT

A method for etching at least partially through a transition metal-containing layer disposed above a substrate is disclosed. The transition metal-containing layer is disposed below an etch mask. The method includes providing a plasma processing system having a plasma processing chamber, and configuring the plasma processing chamber to etch the transition metal-containing layer. The plasma processing chamber configuring process includes configuring the plasma processing chamber to receive a source gas that includes HCl and Ar, and configuring a power supply associated with the plasma processing chamber to supply energy to strike a plasma from the source gas. The plasma processing chamber configuring process further includes configuring the plasma processing chamber to etch at least partially the transition metal-containing layer with the plasma.

28 Claims, 5 Drawing Sheets

OTHER PUBLICATIONS

K. Kinoshita et al., "Reactive Ion Etching of Fe–Si–Al Alloy for Thin Film Head", Nov. 1991, IEEE Transactions on Magnetics, vol. 27, No. 6.

M. J. Vasile et al., "Chemically Assisted Sputter Etching of Permalloy Using CO or $CL_2$", Jul./Aug. 1986, Journal of Vacuum Science Technology.

I. Nakatani, "Ultramicro Fabrications on Fe–Ni Alloys Using Electron–Beam Writing and Reactive–Ion Etching", Sep. 1996, IEEE Transactions on Magnetics, vol. 32, No. 5.

M. G. J. Heijman, "Reactive Sputter Etching of Magnetic Materials in an HCl Plasma", 1988, Plasma Chemistry and Plasma Processing, vol. 8, No. 4.

G. Tyndall, "UV Laser–Induced Etching of the First–Row Transition Metals", 1990, Materials Research Society Symposium, vol. 158.

G. Tyndall et al., "KrF* Laser–Induced Chemical Etching of Nickel with $Br_2$", 1989, Materials Research Society Symposium, vol. 129.

F.C.M.J.M. van Delft et al., "The Etch Mechanisms of Magnetic Materials in an HCl Plasma", 1993, Journal of Nuclear Materials.

J. Ryan et al., "Reactive–Ion–Etch–Compatible Metallization for Partially Covered Contact Applications", 1988, Thin Solid Films. 166.

C. Malek et al., "Reactive Ion Etching of Multilayer Mirrors for X–Ray Projection Lithography Masks", 1991, Microelectronic Engineering 13.

B. Khamsehpour et al., "Fabrication of NiFe Thin Film Elements by Dry Etching Using $CH_4/H_2/O_2$", Nov. 20, 1995, Appl. Phys. Lett. 67 (21).

T. Matthies et al., "Trilevel Reactive Ion Etching Processes for Fabrication of 60 nm Germanium Structures with Aspect Ratio", Sep./Oct. 1993, Journals of Vacuum Science Technology.

M. J. Vasile et al., "$Cl_2$ Chemically Assisted Sputter–Etching of Permalloy", 1985, Materials Research Society Symposia Proceedings, vol. 38.

A. Scherer et al., "Fabrication of Microlasers and Microresonator Optical Switches", Dec. 25, 1989, Appl. Phys. Lett. 55 (26).

K. B. Jung et al., "High Rate Dry Etching of $Ni_{0.8}Fe_{0.2}$ and NiFeCo", Sep. 1, 1997, Appl. Phys. Lett., vol. 71, No. 9.

F.C.M.J.M. van Delft et al., "Classification of Etch Mechanisms for Magnetic Materials", Aug. 22–27, 1993, $11^{th}$ International Symp. on Plasma Chemistry, vol. 3.

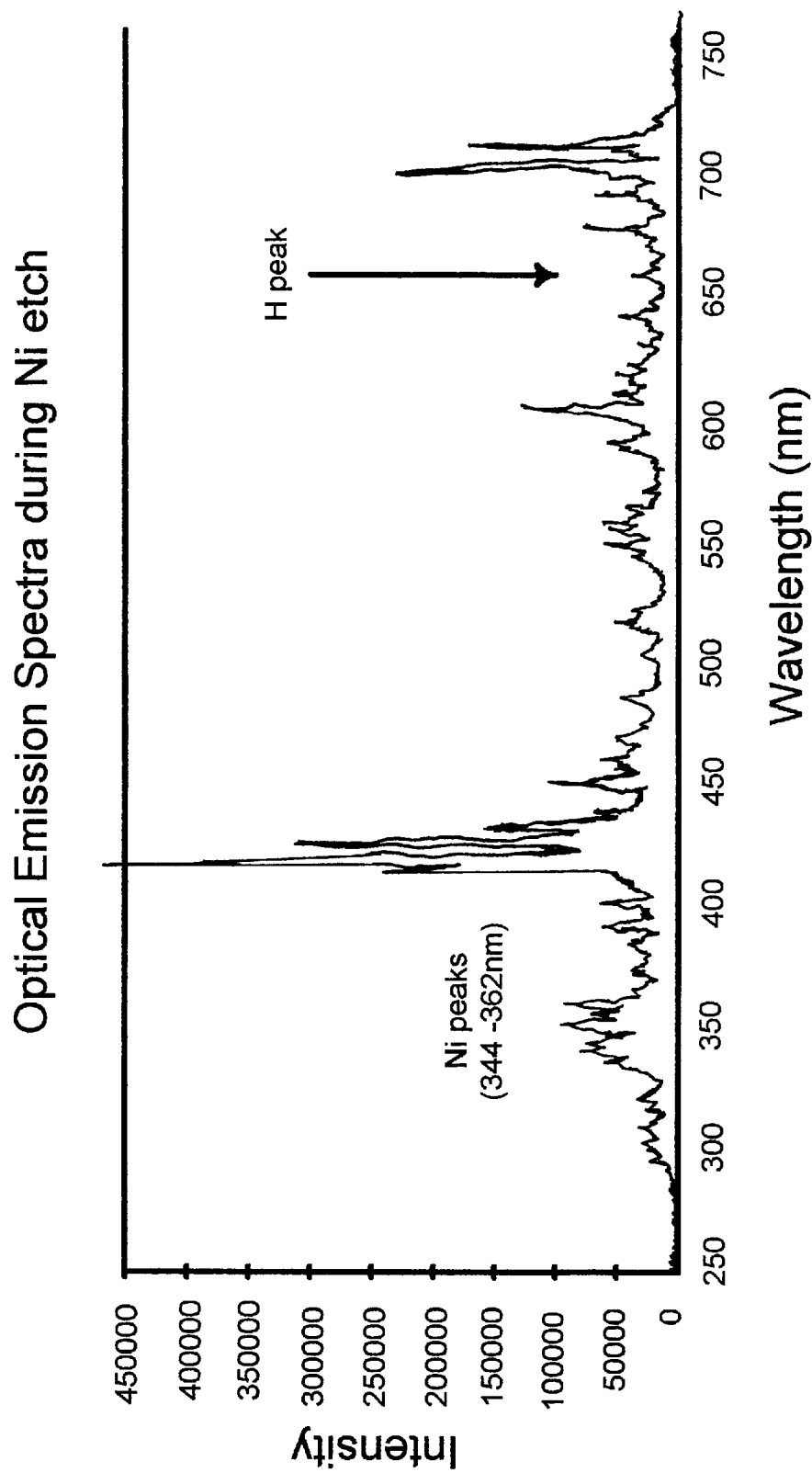

TECHNIQUES FOR ETCHING A TRANSITION METAL-CONTAINING LAYER

BACKGROUND OF THE INVENTION

The present invention relates to the manufacture of electronic devices. More particularly, the present invention relates to improved techniques for etching a transition metal-containing layer during the manufacture of electronic devices.

In the manufacture of certain types of electronic devices, e.g., read/write heads for computer disk drives, integrated circuits, flat panel displays, and the like, a transition metal-containing layer may be employed. As the term is used herein, a transition metal-containing layer generally comprises one or more transition metals or one or more of their alloys. Generally speaking, transition metals include, for example, iron, platinum, cobalt, nickel, as well as copper and/or any of the metals in groups IIIA and IIB of the periodic table. One type of transition metal-containing alloy is, for example, permalloy, which is an iron/nickel/cobalt compound typically employed in the manufacture of thin read/write film heads.

The use of a transition metal-containing layer has posed significant challenges to process engineers since traditional techniques of etching an aluminum metal layer typically do not work well for etching the transition metal-containing layer. By way of example, the etching of the aluminum layer is typically accomplished using $Cl_2$ since $Cl_2$ offers a fast etch rate. Further, aluminum chloride is relatively volatile and can be readily pumped or exhausted away from the etch chamber as a byproduct. However, chlorides of transition metals such as nickel chloride, platinum chloride, and the like, are relatively nonvolatile and tend to be redeposited back on the surface of the substrate during etching, with detrimental consequences to etch profile and etch uniformity. By way of example, the presence of chlorides of transition metals on the surface of the substrate represents unwanted residues and may cause difficulties in post-etch masking removal and poor device performance (e.g., electrical shorts due to bridging).

To facilitate discussion, FIG. 1 depicts a layer stack 100, representing an exemplary layer stack which includes a transition metal-containing layer. Although only a few layers of layer stack 100 are shown, it should be understood that other additional layers above, below, or between the layers shown may be present. Accordingly, although the layers are shown to be in direct contact with one another for ease of illustration, these layers may be separated by one or more other layers in a given layer stack, and terms such as "above" or "below" as employed herein do not necessarily require a direct contact between the layers.

As shown in FIG. 1, layer stack 100 includes an underlying layer 102 which may represent any layer or structure underlying a transition metal-containing layer. The exact composition and structure of underlying 102 depends on the electronic device to be fabricated and may represent, in one case, the substrate itself (e.g., the silicon wafer or the glass panel). Above underlying layer 102, there is shown a transition metal-containing layer 104.

A transition metal-containing layer 104 may include, as mentioned, one or more transition metals or one or more of their alloys. To facilitate etching, a photoresist layer 106 is typically deposited above transition metal-containing layer 104 to form a mask. Photoresist layer 106 is patterned to form exemplary openings 108 and 110 into which the transition metal etchant can enter to etch a trench or via in transition metal-containing layer 104.

In the prior art, the etching of a transition metal-containing layer may be accomplished using a sputtering process, which employs, for example, argon as the bombardment agent. Sputtering is essentially a physical etching process and can produce satisfactory etch rates through transition metal-containing layer 104 if appropriately controlled. It has been found, however, that the sputtered transition metal tends to get redeposited on the substrate surface, including the surface of photoresist layer 106, causing difficulties in the subsequent photoresist removal step. Further, a purely physical etch process tends to have a low selectivity to photoresist, i.e., it may unduly damage the protective regions in photoresist layer 106. The photoresist damage issue is of particular concern in the fabrication of modem high density electronic devices since these devices are closely packed together and require a relative thin photoresist layer 106 during fabrication. The small geometry and high aspect ratios in these modem, high density devices also reduce sputtering efficiency due to, for example, charging.

Another prior art process for etching transition metal-containing layer 104 involves the use of an $Ar/Cl_2$ chemistry in a plasma etch chamber, typically a high pressure/low density plasma etch chamber such as a diode-based etch chamber. As the term is used herein, high pressure processing chambers generally refer to processing chambers whose operating pressure is higher than about 100 mTorr. $Cl_2$ is selected since it provides the ions for the conversion to the metal chlorides. The etch rate is principally controlled by the sputtering efficiency which is typically lower in the high pressure/low density plasma reactors. The chlorine reactive species combine with the sputtered transition metal to form chlorides of transition metals, which tend to be soluble in water. After etching, a rinse in deionized water tends to remove a major portion of the transition metal chlorides.

It has been found, however, that even the $Ar/Cl_2$ chemistry produces less than satisfactory transition metal etch rates when employed in the high pressure/low density plasma processing chambers. Further, the $Ar/Cl_2$ chemistry tends to have a low selectivity to photoresist. In the fabrication of modern, high density electronic devices, this low selectivity to photoresist renders the prior art $Ar/Cl_2$ chemistry unsuitable for use as a transition metal-containing layer etchant in the fabrication of electronic devices. Accordingly, many manufacturers are forced to use a hard mask due to this lower photoresist selectivity issue.

In view of the foregoing, there are desired improved techniques for etching through a transition metal-containing layer. The improved techniques preferably improve the etch rate through the transition metal-containing layer while increasing the selectivity to photoresist in order to allow the transition metal-containing layer to be employed in modem high density electronic devices.

SUMMARY OF THE INVENTION

The invention relates, in one embodiment, to a method for etching at least partially through a transition metal-containing layer disposed above a substrate. The transition metal-containing layer is disposed below an etch mask, e.g., a photoresist mask or a hard mask. The method includes providing a plasma processing system having a plasma processing chamber, and configuring the plasma processing chamber to etch the transition metal-containing layer. The plasma processing chamber configuring process includes configuring the plasma processing chamber to receive a source gas that includes HCl and Ar, and configuring a radio frequency (RF) power supply or other power source (e.g., microwave) associated with the plasma processing chamber to supply RF or other forms of energy to strike a plasma from the source gas. The plasma processing chamber configuring process further includes configuring the plasma processing chamber to etch at least partially the transition metal-containing layer with the plasma.

In another embodiment, the invention relates to a method for etching a transition metal-containing layer disposed above a substrate in a plasma processing chamber. The transition metal-containing layer is disposed below a photoresist mask. The method includes flowing a source gas that includes HCl and Ar into the plasma processing chamber, and striking a plasma in the plasma processing chamber from the source gas. There is also included etching at least partially through the transition metal-containing layer with the plasma.

In yet another embodiment, the invention relates to a method for etching a transition metal-containing layer disposed above a substrate in a high density plasma processing chamber, with the transition metal-containing layer is disposed below a photoresist mask. The method includes flowing a source gas that consists essentially of HCl and Ar into the plasma processing chamber. The method further includes supplying radio frequency (RF) or other forms of energy to at least one electrode of the plasma processing chamber to strike a plasma in the plasma processing chamber from the source gas. There is also included etching at least partially through the transition metal-containing layer with the plasma.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIGS. 3A and 3B illustrate the hydrogen optical emission spectra before and after the nickel etch.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one embodiment of the present invention, there is provided an improved transition metal-containing layer etching technique which employs HCl/Ar as the transition metal etchant. Unlike prior art transition metal etching processes which employ $Cl_2$ as the predominant chlorine-containing source gas, the invention instead employs HCl as the predominant chlorine-containing etchant in order to reduce the density of chlorine species present during etching, thereby reducing etch mask erosion. By way of example, such use reduces photoresist erosion (which in turn increases the selectivity to photoresist).

Equally importantly, and perhaps more importantly, each HCl molecule also contributes one atom of hydrogen for every atom of chlorine during etching. Although the exact mechanism is not known, it is discovered that hydrogen plays a role during the etch of the transition metal-containing layer, and the role played by hydrogen is believed to increase selectivity to photoresist and/or increase the etch rate through the transition metal-containing layer. Further discussion pertaining to this recognition will be shown later herein in the various spectra plot of the plasma during the transition metal etch.

In accordance with another aspect of the present invention, the improved transition metal etching technique preferably employs the HCl/Ar chemistry in a high density, low pressure plasma processing system. Generally speaking, high density refers to ion density in excess of $1e^{13}$ while low pressure generally refers to pressure below 100 mT. By way of example, the invention preferably employs an inductively coupled plasma processing system (such as the TCP™ brand inductively plasma processing systems, e.g., TCP™ 9600, available from LAM Research Corp. of Fremont, California) during the etching of the transition metal-containing layer. It is contemplated, however, that other high density, low pressure plasma processing systems, such as electron cyclotron resonance (ECR) reactors, Helicon Wave (AMAT), MORI (PMT-Tricon), and Microwave may also be employed. After etching, the etched substrate is preferably rinsed using an appropriate rinsing solution (e.g., deionized water) to remove the soluble chlorides of transition metals.

Figure 1:
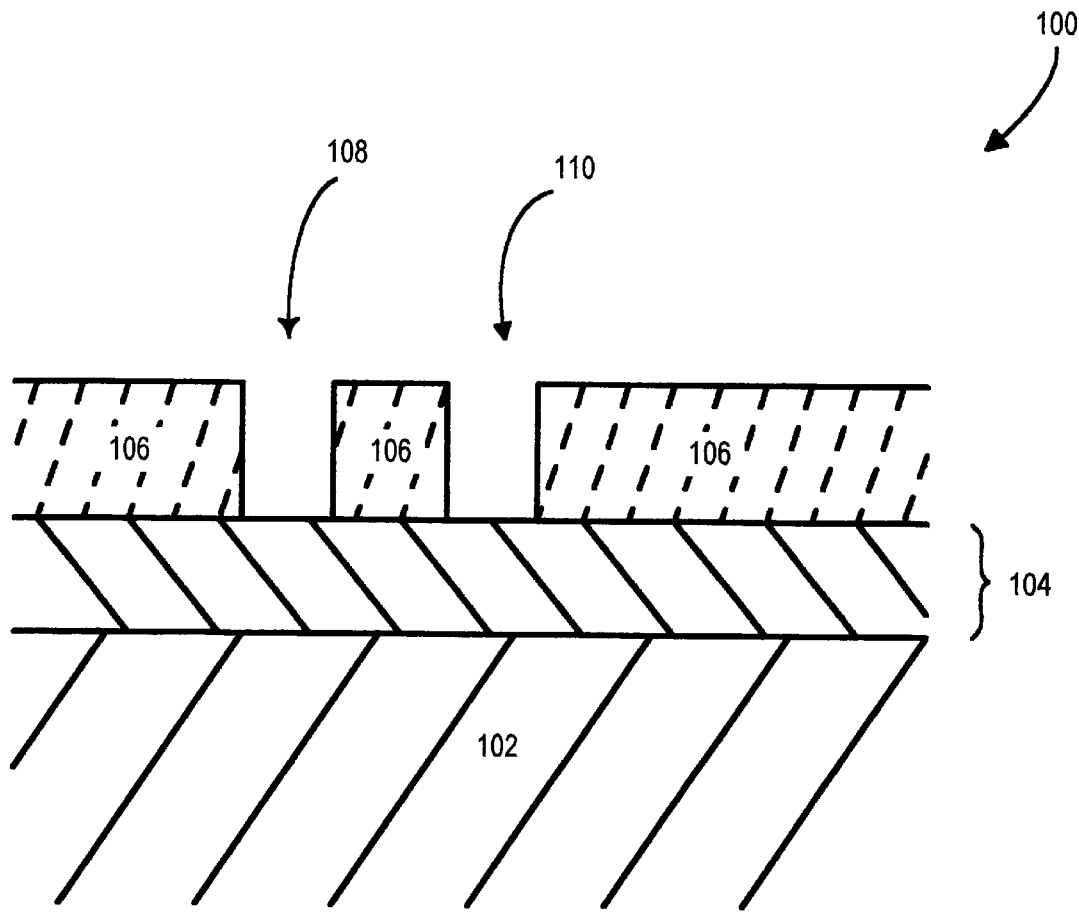
FIG. 1 depicts a exemplary layer stack representing a layer stack which includes a transition metal-containing layer.
Figure 2:
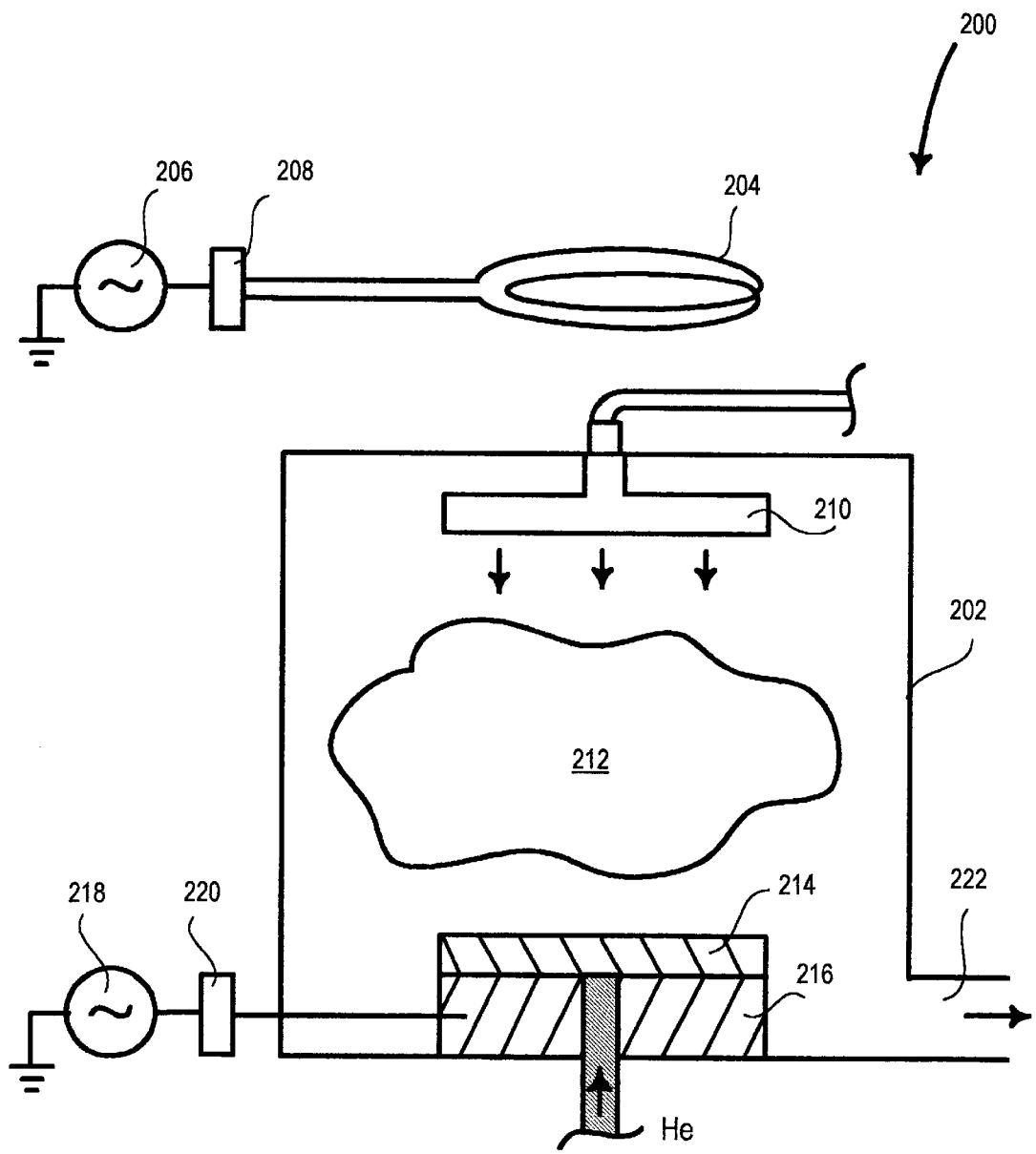
FIG. 2 depicts a simplified sketch of an exemplary inductively coupled plasma processing system, representing suitable low pressure, high density plasma processing system employed to etch the transition metal-containing layer in accordance with one embodiment of the present invention.

To facilitate discussion, FIG. 2 depicts a simplified sketch of an exemplary inductively coupled plasma processing system, representing suitable low pressure, high density plasma processing system employed to etch the transition metal-containing layer using the HCl/Ar chemistry in accordance with one embodiment of the present invention. Referring now to FIG. 2, a plasma processing system 200 includes a plasma processing chamber 202. Above chamber 202, there is disposed an electrode 204 which is implemented by a coil in the example of FIG. 2 although other mechanisms for coupling the RF energy to the plasma within the plasma processing chamber may also be employed. Electrode 204 is energized by a radio frequency (RF) generator 206 via a matching network 208. In the example of FIG. 2, RF generator 206 sources RF energy having a frequency of about 13.56 MHz although other appropriate frequencies may also be employed.

Within plasma processing chamber 202, there is shown a shower head 210, representing the gas distribution apparatus for releasing gaseous etchant materials, e.g., the inventive transition metal source gas, into the RF-induced plasma region 212 between itself and a substrate 214. However, other gas distribution apparatus such as gas distribution rings or simply ports disposed in the chamber walls may also be employed. Substrate 214 having thereon a transition metal-containing layer is introduced into plasma processing chamber 202 and disposed on a chuck 216, which acts as a second electrode and is preferably biased by a radio frequency generator 218 through a matching network 220. Like RF generator 206, RF generator 218 in the example of FIG. 2 also sources RF energy having a frequency of about 13.56 MHz although other suitable frequencies, including a frequency different from that sourced by RF generator 206, may also be employed.

A heat exchange gas such as helium is introduced under pressure (e.g., about 2 to 10 Torr in one embodiment) into the region in between chuck 216 and substrate 214 to control the heat transfer between the substrate and the chuck to ensure uniform and repeatable etching results. To facilitate etching, the source gas is flowed through shower head 210 and ignited by the RF energy supplied by RF generators 206 and 218. During the transition metal-containing layer etching, the pressure within chamber 202 is preferably kept low, e.g., between about 0.5 to 500 mTorr in one embodiment. Some of the etch byproduct gases is exhausted out of chamber 202 through exhaust port 222 (e.g., using an appropriate turbo pump arrangement).

After etching, substrate 214 is removed from plasma processing chamber 202 to be rinsed in an appropriate rinsing apparatus to further remove the chlorides of transition metals on the substrate, which is formed thereon during etching. In the aforementioned TCP™ 9600SE system, subsequent rinsing is advantageously performed in an atmospheric passivation module (APM), which is one of the modules of the TCP™ 9600 etching system.

As mentioned earlier, the invention employs a source gas that includes HCl and Ar to etch through the transition metal-containing layer. The use of HCl instead of $Cl_2$ as the predominant chlorine-containing etchant component gas advantageously reduces the erosion of the etch mask (i.e., the photoresist mask or hard mask), which in turn increases the selectivity to the masking material, e.g., photoresist.

In a nonobvious and not yet fully understood manner, the presence of the hydrogen species is believed to contribute to the etching process. It is speculated that the presence of hydrogen contributes to the high transition metal etch rate and/or the high selectivity to photoresist achievable in the present invention. While not wishing to be bound by theory, it is speculated that the hydrogen helps passivate the carbon-hydrogen bond in the photoresist, thereby increasing the selectivity to photoresist.

Figure 3B:
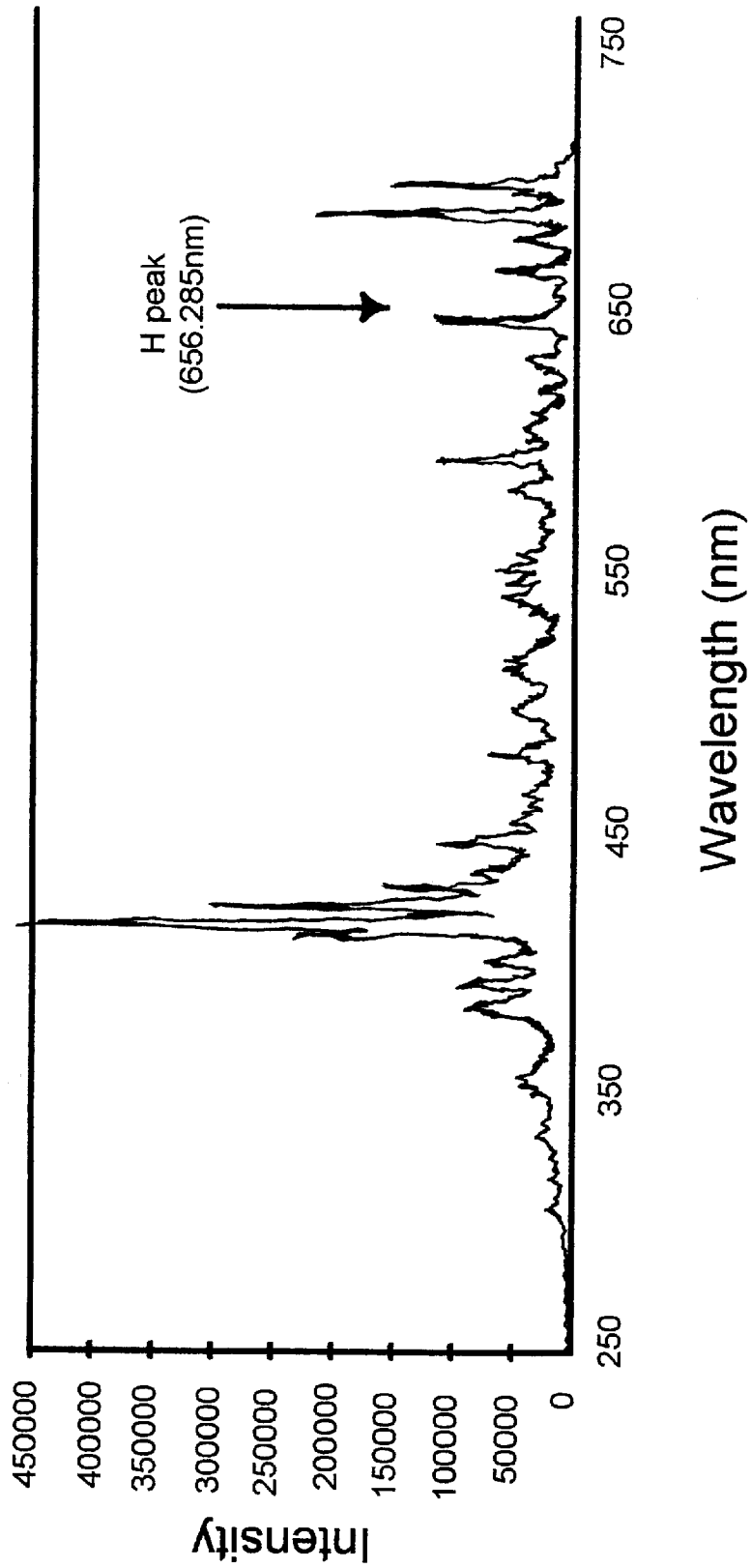

To illustrate the role of hydrogen, FIGS. 3A and 3B depict the optical emission spectra during and after the etching of a nickel-containing layer. In the example of FIGS. 3A and 3B, the layer to be etch represents a three-layer sandwich of tungsten overlying nickel overlying germanium. The tungsten layer is about 2,500 angstroms thick, the nickel layer is about 350 angstroms thick and the germanium layer is about 400 angstroms thick. The photoresist layer is about 10,000 angstroms thick. The three layer sandwich of FIGS. 3A and 3B is disposed above a four inch GaAs substrate.

In FIG. 3A, the hydrogen peak is absent during the nickel etch. The pertinent hydrogen peak is about 656.285 nm (See, Spectral Library of Persistent Emission Lines, D.S. Malchow, ed. E.G. & G. Princeton Applied Research Co., 1990). After nickel etching, the hydrogen peak is present in the optical emission spectra of FIG. 3B. FIGS. 3A and 3B illustrate that hydrogen plays a role in the etching of the transition metal-containing layer although, as mentioned earlier, its exact mechanism is not yet fully understood.

Although the base chemistry includes HCl and Ar, additives are also possible as long as they do not substantially change the basic character of the etchant, which contributes argon, chlorine, and hydrogen to etch the transition metal-containing layer. For example, $Cl_2$ may be added as an etchant to increase the number of chlorine species in the plasma region during etching. The increase in the number of chlorine species may increase the rate of byproduct conversion (i.e., more of the sputtered transition metal can be converted to a chloride of transition metal). However, it is desirable to moderate the amount of chlorine species present (either by reducing the $Cl_2$ flow or the HCl flow) so as not to detrimentally effect the selectivity to photoresist since chlorine tends to attack photoresist. As further examples, one or more of the inert chemicals (such as He, Ne, and Xe) may be added. Further, one or more of the hydrogen-containing chemicals, such as HBr, HI, $NH_3$, $H_2$, $H_2O$, $H_2O_2$, $CH_4$, $C_2H_6$, $C_2H_4$, $C_2H_2$, $C_xH_{X+4}$, $C_xH_{X+2}$, and $SiH_4$ may be added. Additionally, any of the chlorine-containing chemicals such as $SiCl_4$, $CCl_4$, $CHCl_3$, $Cl_2$, $CH_2Cl_2$, and $CHCl_3$ may also be added.

EXAMPLES

In the discussion below, an exemplary transition metal etch is discussed in detail. It should be noted, however, that the parameters and process steps discussed below are illustrative only and are not limiting of the overall concept of the present invention. In the example below, the aforementioned three-layer sandwich of tungsten, nickel, and germanium on a four-inch gallium arsenide substrate is etched in the aforementioned TCP™ 9600SE plasma processing system.

In this example, the three-layer sandwich is etched using a process that includes an HCl flow of about 10 sccm (standard cubic centimeter per minute), and an Ar flow of about 50 sccm. The pressure within the plasma processing chamber is about 5 mTorr while the helium pressure for cooling is about 2 T. The electrode temperature is about 40° C. The top electrode power is set at about 250 watts, as is the power to the bottom electrode.

It is contemplated, however, that the pressure may vary anywhere from 0.5 mT to 500 mT and more preferably between 1 mT and 100 mT for the same or different substrates. Likewise, although the Ar flow is about 83 percent of the total flow in the example discussed, it is contemplated that the Ar flow may range from between about 1 percent and about 99 percent and more preferably from about 5 percent to about 95 percent for the same or different substrates. The exact Ar:HCl ratio depends on the tradeoff between transition metal removal (using Ar as a bombardment agent), chloride conversion rate (which is influenced by the density of the chlorine species in the chamber), and photoresist erosion rate. A higher Ar:HCl ratio tends to increase sputtering removal but the reduced density of the Cl species tends to lower the chloride conversion rate. Conversely, a lower Ar:HCl ratio tends to increase the chloride conversion rate due to the increased density of the Cl species, albeit at the risk of unduly attacking the photoresist features. It should be apparent to those skilled in the art given this disclosure that the exact Ar:HCl ratio varies widely depending on the desired etch result (in terms of etch rate, photoresist retention, and the like) as well as the configuration of the specific etch chamber. It should also be apparent to those skilled in the art that the exact parameters required in a particular etch depends on the desired throughput, etch rate, selectivity to photoresist, composition of the layers to be etched, size of substrate, design of the plasma processing system, and/or other parameters.

After etching, the substrate is rinsed with deionized water in the atmospheric passivation module (APM) of the TCP™

9600 plasma processing system. Rinsing may be done with deionized water at a temperature ranging from ambient to about 90° C. The substrate may be rinsed for as long as needed, e.g., about 30 minutes to about 120 minutes in some cases.

Figure 4:
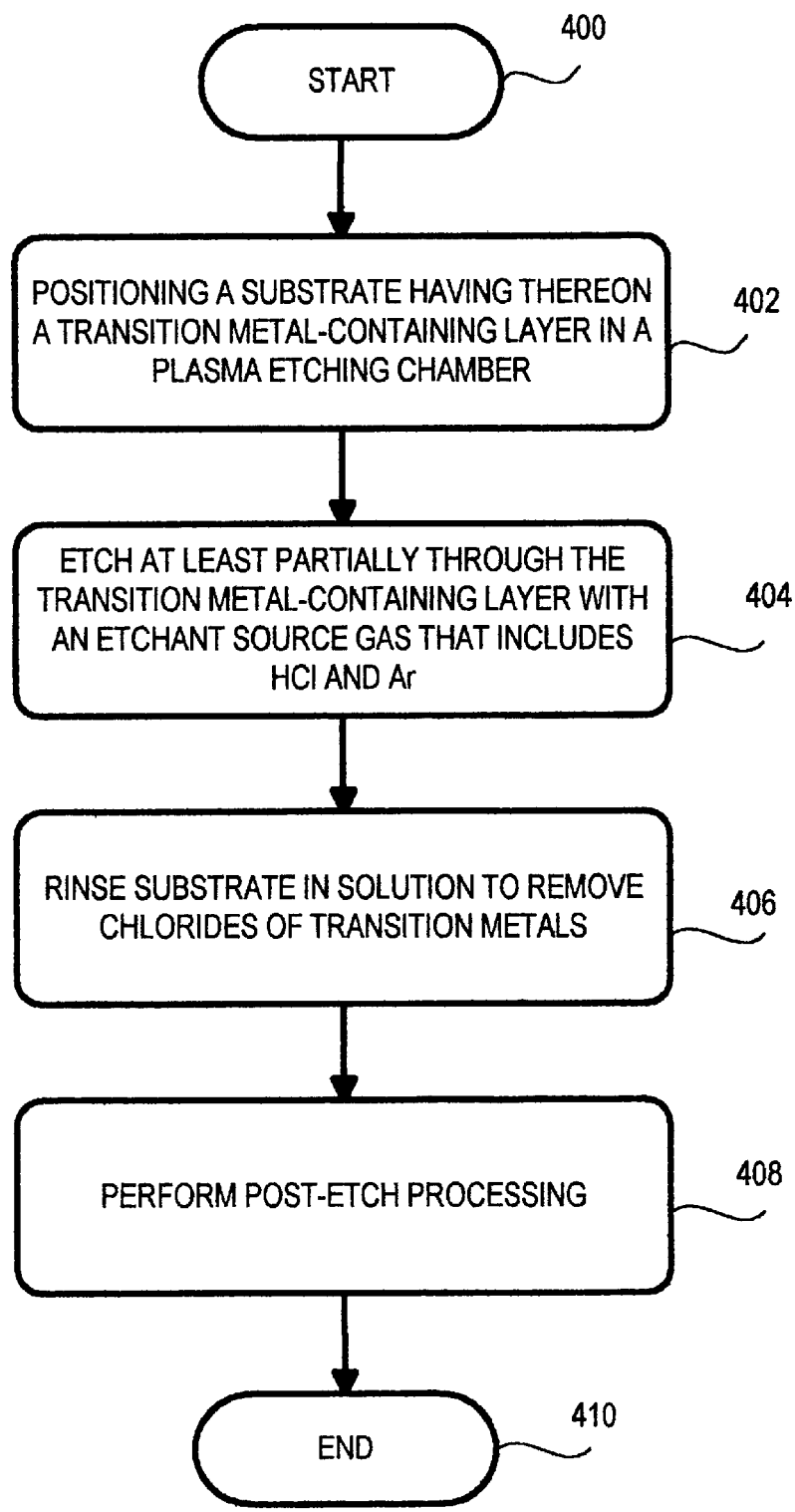
FIG. 4 illustrates, in accordance with one embodiment of the present invention, the steps employed in etching through a transition metal-containing layer on a substrate.

FIG. 4 illustrates, in accordance with one embodiment of the present invention, the steps employed in etching through a transition metal-containing layer on a substrate. In step 402, a substrate having thereon a transition metal-containing layer to be etched is positioned into the plasma etching chamber. To facilitate etching, the transition metal-containing layer is typically disposed below a photoresist mask. In step 404, at least part of the transition metal-containing layer of the substrate is etched in the plasma etching chamber using a source gas that includes HCl and Ar. During step 404, some of the etchant byproducts, including chlorides of transition metals, is exhausted away from the plasma etching chamber.

In step 406, the substrate is rinsed, after etching in step 404, in water (such as deionized water) to remove the chlorides of transition metals from the substrate surface. The chlorides of transition metals are formed during etching in step 404. The temperature of the water employed may be varied to optimize chloride removal. In general, increasing the temperature of the deionized water tends to improve chloride dissolution and removal. In step 408, conventional post processing steps may be performed to complete the manufacture of the desired electronic device. By way of example, the substrate may be further processed to form the desired integrated circuit(s), flat panel display(s), or read/write head(s) to be incorporated in any number of electronic systems, including computers.

As can be appreciated from the foregoing, the invention advantageously employs a source gas that includes HCl and Ar to etch through the transition metal-containing layer. In a nonobvious and counterintuitive manner, the invention deliberately uses HCl instead of $Cl_2$ as the predominant chlorine-containing gas to provide the chlorine species for the conversion of the metal to metal chlorides. The use of HCl over $Cl_2$ as the predominant chlorine-containing source gas is counterintuitive since a lower density of chlorine species has been thought to reduce the metal chloride conversion rate and its subsequent removal. Nevertheless, the reduced density of chlorine species due to the use of the HCl source gas advantageously contributes to improving the photoresist selectivity, which renders the inventive process more suitable for use in fabricating modem high density electronic devices.

Further, HCl contributes hydrogen species in the plasma etch environment. As mentioned, it is believed that the hydrogen species help in increasing the photoresist selectivity and/or the etch rate through the transition metal-containing layer. Additionally, the use of a high density (e.g., above about $1e^{13}$ in ion density) and optionally low pressure plasma etching chamber to etch through the transition metal-containing layer advantageously increases the transition metal etch rate relative to the etch rate achieved in the high pressure/low density plasma etch chamber (which is employed in the prior art transition metal etch).

While this invention has been described in terms of several preferred embodiments, there are alterations, permutations, and equivalents which fall within the scope of this invention. It should also be noted that there are may alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for configuring a plasma processing system to etch at least partially through a transition metal-containing layer disposed above a substrate, said transition metal-containing layer being disposed below an etch mask, comprising:

providing said plasma processing system having a plasma processing chamber; and configuring said plasma processing chamber to etch said transition metal-containing layer, said configuring includes, configuring said plasma processing chamber to receive a source gas that consists essentially of HCl and Ar, wherein each HCl molecule contributes essentially one atom of hydrogen for every atom of chlorine during etching;

configuring a power supply associated with said plasma processing chamber to supply energy to strike a plasma from said source gas; and configuring said plasma processing chamber to etch at least partially said transition metal-containing layer with said plasma, whereby the presence of hydrogen contributes to a high transition metal-containing layer etch rate.

2. The method of claim 1 wherein said power supply is a radio frequency (RF) power supply and said energy is radio frequency (RF) energy.

3. The method of claim 1 wherein said plasma processing chamber is a high density plasma processing chamber.

4. The method of claim 1 wherein said plasma processing system further includes a rinsing module configurable to rinse said substrate with water, said method further comprising configuring said rinsing module to rinse said substrate after said substrate is etched with said source gas in said plasma processing chamber.

5. The method of claim 1 wherein said transition metal-containing layer comprises a transition metal selected from the group consisting of elements in groups IIIA through IIB of the periodic table.

6. The method of claim 1 wherein said transition metal-containing layer comprises a transition metal selected from the group consisting essentially of iron, platinum, cobalt, and nickel.

7. The method of claim 6 wherein said plasma processing chamber is an inductively coupled high density plasma processing chamber.

8. The method of claim 7 wherein a flow ratio of said HCl to said Ar is about 1:99 to about 99:1.

9. The method of claim 1, whereby the presence of hydrogen contributes to a high selectivity to photoresist.

10. The method of claim 1, whereby the HCl is used as the predominant chlorine-containing etchant in order to reduce the density of chlorine present during etching, which thereby reduces mask etch erosion.

11. A method for etching a transition metal-containing layer disposed above a substrate in a plasma processing chamber, said transition metal-containing layer being disposed below an etch mask, comprising:

flowing a source gas that consist essentially of HCl and Ar into said plasma processing chamber, whereby each HCl molecule contributes essentially one atom of hydrogen for every atom of chlorine during etching;

striking a plasma in said plasma processing chamber from said source gas; and etching at least partially through said transition metal-containing layer with said plasma, whereby the presence of hydrogen contributes to a high transition metal-containing layer etch rate.

12. The method of claim 11 wherein said transition metal-containing layer comprises a transition metal selected from the group consisting of elements in groups IIIA through IIB of the periodic table.

13. The method of claim 11 wherein said transition metal-containing layer comprises a transition metal selected from the group consisting essentially of iron, platinum, cobalt, and nickel.

14. The method of claim 13 wherein said plasma processing chamber is a high density plasma processing chamber.

15. The method of claim 14 wherein said plasma processing chamber is an inductively coupled plasma processing chamber.

16. The method of claim 15 wherein said source gas consists essentially of said HCl and said Ar.

17. The method of claim 16 further comprising rinsing said substrate after said etching with deionized water to remove chlorides of said transition metal.

18. The method of claim 13 wherein a flow ratio of said HCl to said Ar is about 95:5 to about 5:95.

19. The method of claim 11, whereby the presence of hydrogen contributes to a high selectivity to photoresist.

20. The method of claim 11, whereby the HCl is used as the predominant chlorine-containing etchant in order to reduce the density of chlorine present during etching, which thereby reduces mask etch erosion.

21. A method for etching a transition metal-containing layer disposed above a substrate in a high density plasma processing chamber, said transition metal-containing layer being disposed below an etch mask, comprising:

flowing a source gas that consists essentially of HCl and Ar into said plasma processing chamber, whereby each HCl molecule contributes essentially one atom of hydrogen for every atom of chlorine during etching;

supplying radio frequency (RF) energy to at least one electrode of said plasma processing chamber to strike a plasma in said plasma processing chamber from said source gas;

etching at least partially through said transition metal-containing layer with said plasma, whereby the presence of hydrogen contributes to a high transition metal-containing layer etch rate.

22. The method of claim 21 wherein said transition metal-containing layer comprises a transition metal selected from the group consisting of elements in groups IIIA through IIB of the periodic table.

23. The method of claim 21 wherein said transition metal-containing layer comprises a transition metal selected from the group consisting essentially of iron, platinum, cobalt, and nickel.

24. The method of claim 23 wherein said plasma processing chamber is an inductively coupled plasma processing chamber, said at least one electrode is a coil.

25. The method of claim 24 wherein a flow ratio of said HCl to said Ar is about 90:10 to about 10:90.

26. The method of claim 18 further comprising rinsing said substrate after said etching with deionized water to remove chlorides of said transition metal.

27. The method of claim 21, whereby the presence of hydrogen contributes to a high selectivity to photoresist.

28. The method of claim 21, whereby the HCl is used as the predominant chlorine-containing etchant in order to reduce the density of chlorine present during etching, which thereby reduces mask etch erosion.

* * * * *